US006809852B2

(12) United States Patent
Tao et al.

(10) Patent No.: US 6,809,852 B2
(45) Date of Patent: Oct. 26, 2004

(54) MICROSYSTEM PACKAGE STRUCTURE

(75) Inventors: Su Tao, Kaohsiung (TW); Kuo-Chung Yee, Taipei (TW); Jen-Chieh Kao, Kaohsiung (TW); Chih-Lung Chen, Fengshan (TW); Hsing-Jung Liau, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/603,957

(22) Filed: Jun. 24, 2003

(65) Prior Publication Data

US 2004/0184133 A1 Sep. 23, 2004

(30) Foreign Application Priority Data

Mar. 18, 2003  (TW) ........................................ 92105867 A

(51) Int. Cl.$^7$ ........................ G02B 26/00; H01L 31/0232
(52) U.S. Cl. ........................ 359/290; 257/432; 257/433; 257/434; 257/777
(58) Field of Search ......................... 359/290; 257/432, 257/433, 434, 680, 777

(56) References Cited

U.S. PATENT DOCUMENTS 6,384,473 B1 * 5/2002 Peterson et al. ............ 257/680

* cited by examiner

Primary Examiner—Hung Xuan Dang
Assistant Examiner—Tuyen Tra
(74) Attorney, Agent, or Firm—J.C. Patents

(57) ABSTRACT

The present invention relates to a package structure for a microsystem, comprising a substrate, a chip, an adhesive structure, a carrying substrate, a micro-mechanism, a plurality of wires, an annular body and a transparent plate. The chip is placed on the substrate. The annular adhesive structure having an opening is placed on the chip. The carrying substrate is placed on the adhesive structure, thus forming an interspace between the chip, the adhesive structure and the carrying substrate. The pressure inside the interspace can be balanced with the pressure outside the interspace through the opening. The micro-mechanism is disposed on the carrying substrate. The annular body is formed on the substrate and the transparent plate is attached on the annular body, thus forming a closed chamber between the substrate, the annular body and the transparent plate. The chip, the micro-mechanism, the adhesive structure, the carrying substrate and the wires are disposed within the closed chamber.

14 Claims, 5 Drawing Sheets

MICROSYSTEM PACKAGE STRUCTURE

CROSS-REFERENCE TO RELATED APPLICATION

This application claims the priority benefit of Taiwan application serial no. 92105867, filed Mar. 18, 2003.

BACKGROUND OF THE INVENTION

1. Field of Invention

The present invention relates to a package structure for a microsystem. More particularly, the present invention relates to a package structure for a microsystem, which has an annular adhesive structure with an opening between the micro-mirror-mechanism and the CMOS chip.

2. Description of Related Art

For the projecting instruments, the planar images are enlarged by being projected onto the large screens, so that more persons can view the images at the same time. At the present, the projectors are commonly used for conferences or educational training in companies and schools. Furthermore, the recent model projectors can be connected directly to the notebook computers or desktop computers, for projecting the images, texts or charts. In addition, the projection television displays images on the screen by way of projection.

FIG. 1 is a display view illustrating a projecting apparatus in general. As shown in FIG. 1, the projecting apparatus 100 comprises a light source 102, front lens 104, 108, a color filter 106, a microsystem package structure 120, a lens 110 and a screen 112. Light 114 coming from the light source 102 strikes the lens 104 and is then refracted by the lens 104. Light 114, after refracted by lens 104, passes the color filter 106 and strikes the lens 108. After being refracted by the lens 108, light 114 is projected on the microsystem package structure 120. Then microsystem package structure 120 includes a CMOS chip and a plurality of micro-mirror sets. Light 114, controlled by the rotation of the micro-mirror sets, is reflected to the screen 112 through the lens 110. However, heat is generated during the operation of CMOS chip and from the focused light onto the micro-mirror sets. The generated heat will raise the temperature and increase the pressure of the system, leading to distortion or deformation of the system and inaccurate and faulty control of the light reflection path for the projecting apparatus.

SUMMARY OF THE INVENTION

The present invention provides a microsystem package structure, which can accurately control the projective locations of the light through reflection of micro-mirrors, without distortion of the micro-mirror-mechanism resulting from high pressure or temperature.

As embodied and broadly described herein, the present invention provides a microsystem package structure comprising a substrate, a chip, a micro-mechanism, a adhesive structure, a plurality of wires, an annular body and a transparent plate. The chip is attached to the substrate and electrically connected to the substrate through wires. The adhesive structure, in an annular shape, has an opening and is arranged between the chip and the carrying substrate. Since the carrying substrate is placed on the adhesive structure, an interspace is formed between the chip, the adhesive structure and the carrying substrate. The pressure inside the interspace can be balanced with the pressure outside the interspace through the opening.

The opening of the adhesive structure can be arranged in the central portion of one side of the adhesive structure or at corners of the adhesive structure. Alternatively, the adhesive structure includes a plurality of openings. The adhesive structure has a shape of a hollow tetragon, for example. The adhesive structure can further include a protrusion around the opening and on the outer side of the adhesive structure. The microsystem package structure can further includes desiccant within the closed chamber between the substrate, the annular body and the transparent plate.

In conclusion, the present invention can greatly reduce distortion of the carrying substrate, resulting from generated heat during the operation of CMOS chip and from the focused light onto the micro-mirror-mechanism. If the interspace is closed (sealed), the generated heat will heat up the interspace and the pressure of this space is increased with the elevated temperature, leading to distortion of the above carrying substrate. However, in the present invention, the interspace is connected to the chamber through the opening of the adhesive structure, the pressure of the interspace is balanced and lowered, so that distortion of the carrying substrate is prevented and the angle or position of the micromirror is well controlled. As a result, the light reflected by the micro-mirror-mechanism is precisely controlled and projected to the desired location.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
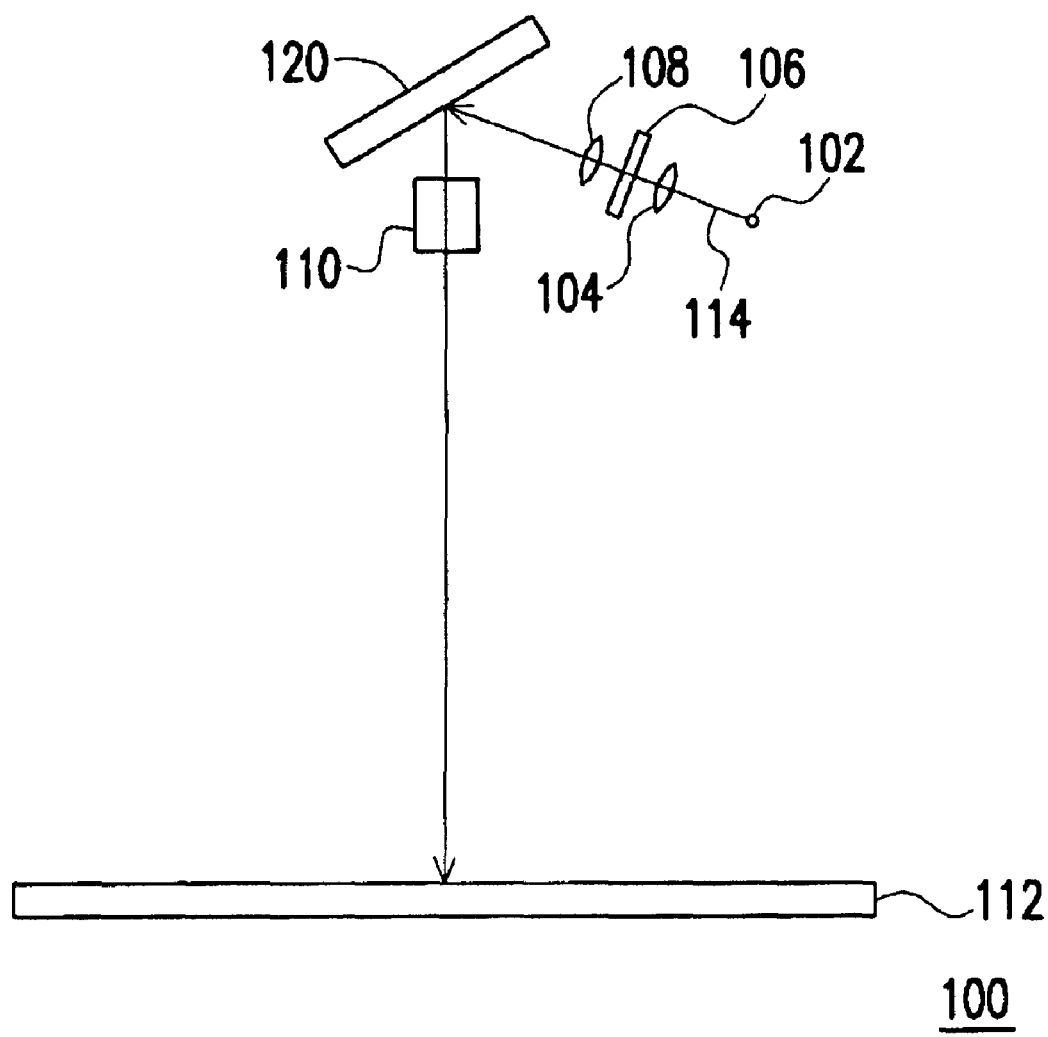
FIG. 1 is a display view illustrating a projecting apparatus in general.
Figure 2:
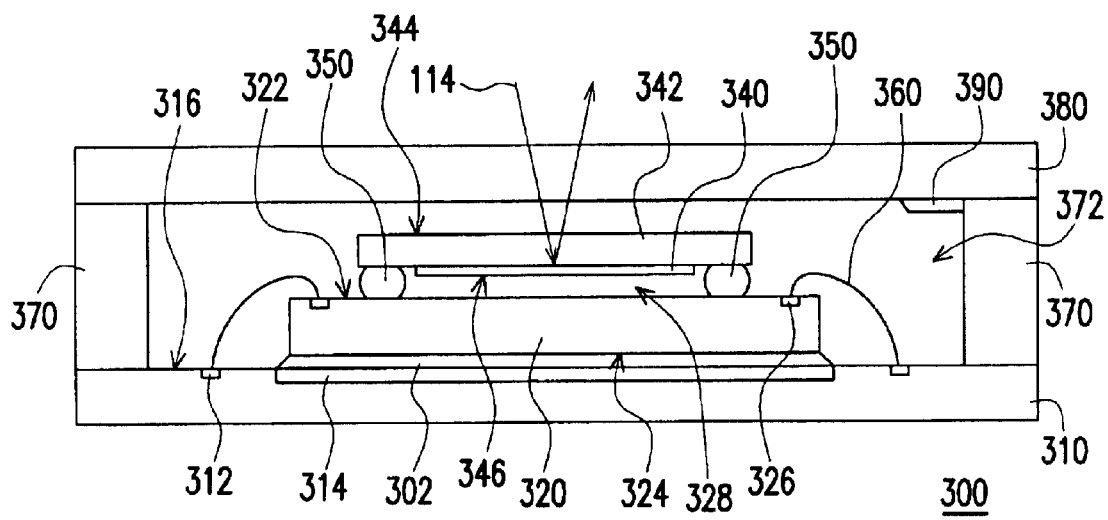
FIG. 2 is a cross-sectional, expanded view of a microsystem package structure according to a first preferred embodiment of the present invention.
Figure 3:
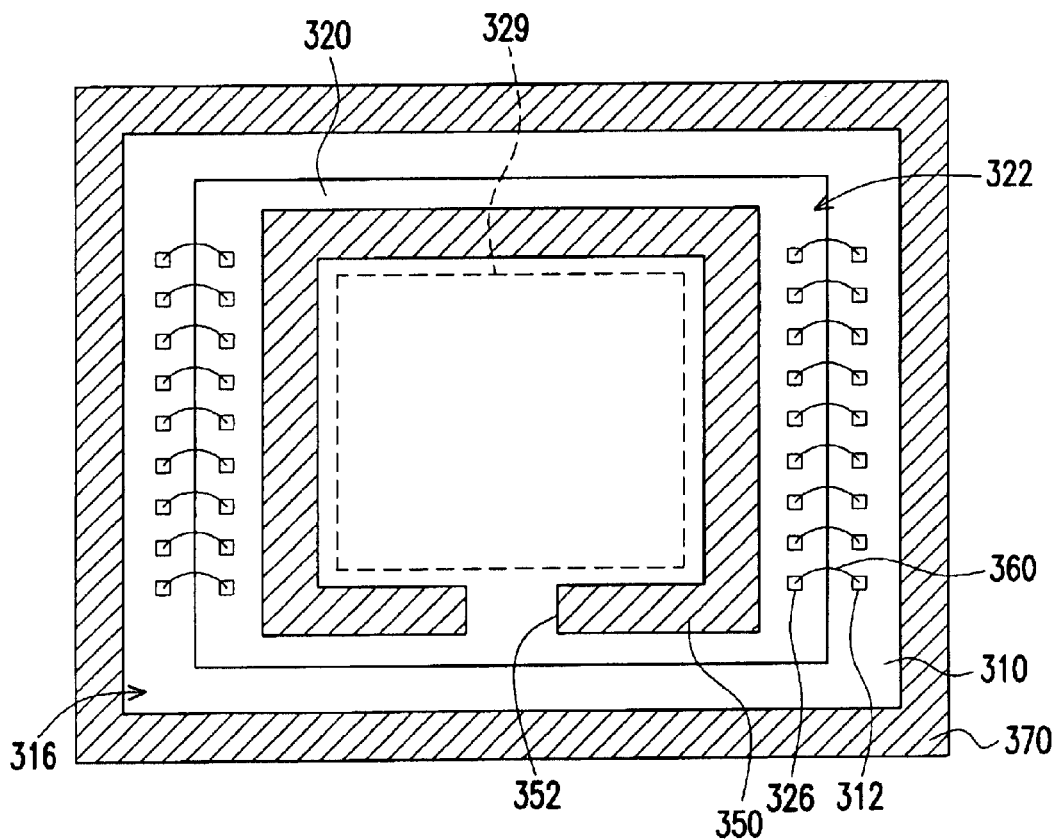
FIG. 3 is a top view of an adhesive structure according to a first preferred embodiment of the present invention.

FIG. 2 is a cross-sectional, expanded view of a microsystem package structure according to a first preferred embodiment of the present invention, while FIG. 3 is a top view of an adhesive structure according to a first preferred embodiment of the present invention.

As shown in FIGS. 2–3, the microsystem package structure 200 comprises a substrate 310, a CMOS chip 320, a micro-mirror-mechanism 340, an adhesive structure 350 and a plurality of wires 360. A plurality of nodes 312 is disposed on a surface 316 of the substrate 310. The surface 316 further includes a CMOS chip region 314, and the nodes 312 are arranged alongside the CMOS chip region 314. The CMOS chip 320 has an active surface 322 and a reverse back surface 324. A plurality of chip nodes 326 is arranged in an outer (peripheral) region of the active surface 322 of the CMOS chip 320. The back surface 324 of the CMOS chip 320 is attached to the CMOS chip region 314 of the substrate 310 through an adhesive layer 302.

The micro-mirror-mechanism 340 is disposed on a carrying substrate 342 that has a top surface 344 and a bottom surface 346. The carrying substrate 342 can be transparent, but not limited to be transparent. The micro-mirror-mechanism 340 is arranged on the bottom surface 346 of the carrying substrate 342, while the adhesive structure 350 is arranged between the CMOS chip 320 and the carrying substrate 342. The adhesive structure 350 is in an annular shape or a ring shape, but not necessarily round. The adhesive structure 350 has an opening 352, located on a middle portion of one side of the annular adhesive structure. Since the carrying substrate 342 is placed on the adhesive structure 350, an interspace 328 is formed between the chip 320, the adhesive structure 350 and the carrying substrate 342. The pressure inside the interspace 328 can be balanced with the pressure outside the interspace through the opening 352. That is, the pressure inside the adhesive structure 350 can be balanced with the pressure outside the adhesive structure through the opening 352.

The active surface 322 of the CMOS chip 320 has a memory region 329 that includes a plurality of memory cells, and each memory cell can store either "0" or "1". The memory region 329 corresponds to the central region of the annular adhesive structure 350, while the chip nodes 326 are arranged on the peripheral region of the annular adhesive structure 350. One terminal of the wire 360 is electrically connected to the chip node 326, while the other terminal of the wire 360 is electrically connected to the node 312 of the substrate 310, this electrically connecting the CMOS chip 320 and the substrate 310.

The microsystem package structure 300 further includes an annular body 370 and a transparent plate 380. The annular body 370 is attached to the surface 316 of the substrate 310 and the transparent plate 380 is disposed on the annular body 370, so that a closed chamber 372 is formed between the substrate 310, the annular body 370 and the transparent plate 380. The CMOS chip 320, the micro-mirror-mechanism 340, the adhesive structure 350, the carrying substrate 342 and the wires 360 are disposed within the closed chamber 372. The transparent plate 380 is, for example, made of glass. As shown in FIG. 2, light 114, passing the transparent plate 380, strikes on micro-mirror sets (in FIGS. 4–5) of the micro-mirror-mechanism 340. By controlling the angle of the micro-mirror sets, it is possible to control the reflection direction of light 114, i.e. certain locations on the screen (not shown).

The microsystem package structure further comprises a desiccant 390, within the closed chamber 372 between the substrate 310, the annular body 370 and the transparent plate 380. For example, the desiccant 390 is attached to a corner of the closed chamber 372. The desiccant 390 can help the closed chamber 372 between the substrate 310, the annular body 370 and the transparent plate 380 remain in a dry state. Moreover, with the opening 352 in the adhesive structure 350, the interspace 328 can also remain dry.

Figure 4:
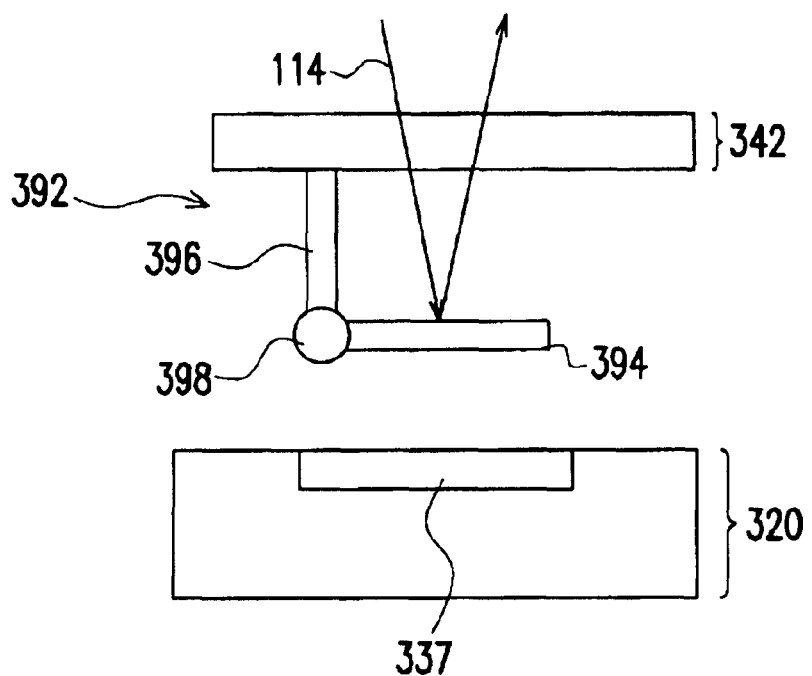
FIGS. 4 and 5 are display views illustrating the CMOS chip controlling the micro-mirror-mechanism by electrostatic attraction, respectively.
Figure 5:
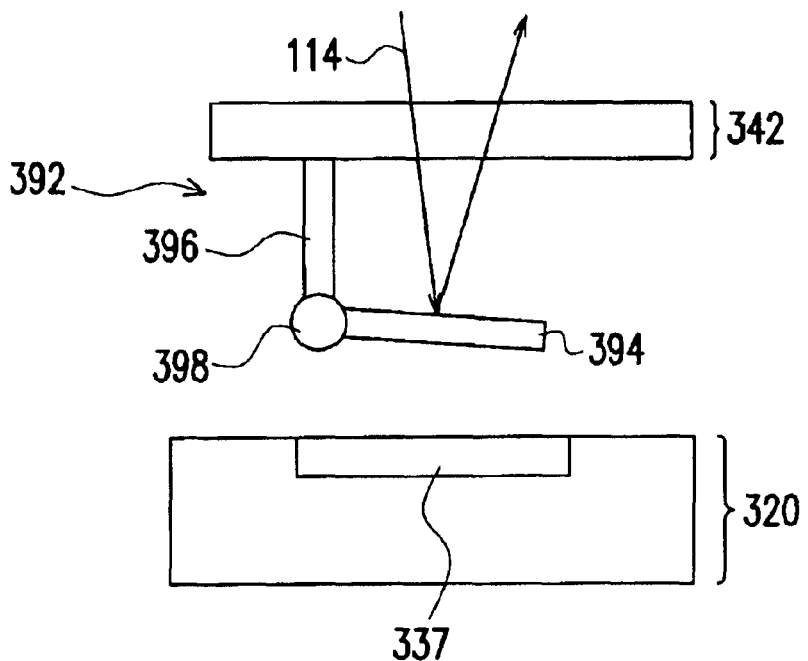

FIGS. 4 and 5 are display views illustrating the CMOS chip controlling the micro-mirror-mechanism by electrostatic attraction. The micro-mirror-mechanism 340 includes a plurality of micro-mirror sets 392, disposed on the carrying substrate 342. Each micro-mirror set 392 is arranged above the corresponding memory cell 337 of the CMOS chip 320. One micro-mirror set 392 includes a micro-mirror 394, a supporting stalk 396 and a hinge 398. One end of the stalk 396 is connected to the carrying substrate 342, while the other end of the stalk 396 is connected to the hinge 398. One side of the micro-mirror 394 is also connected to the hinge 398, so that the micromirror 394 can rotate by using the hinge 398 as the rotation center. For example, a positive voltage is applied to the carrying substrate 342, through the stalk 396 and the hinge 398, so that the micromirror 394 is charged positively. If the corresponding memory cell 337 is negatively charged (such as, in the "1" state), the electrostatic attraction between the memory cell 337 and the micromirror 394 results in the rotation of the micromirror 394 (as shown in FIG. 5). Under different circumstances, this micro-mirror-mechanism can take advantage of electrostatic repulsion as well. In general, the rotation of the micromirror 394 in the micromirror set 392 is adjusted by controlling the logic status ("0" or "1") of the memory cell 337.

In the above embodiment, heat is generated during the operation of CMOS chip 320 and from the focused light onto the micro-mirror-mechanism 340. Because of heat exchange and air convection (cross-ventilation), the temperature of the air within the interspace 328 is greatly increased. However, the air pressure of the interspace 328 will not be too high to cause great distortion of the carrying substrate 342, since the interspace 328 is not closed and connected to the chamber 372 through the opening 352 of the adhesive structure 350. That is, through the opening 352 of the adhesive structure 350, the pressure of the interspace 328 is regulated and lowered, so that distortion of the carrying substrate 342 is reduced and the angle or position of the micromirror 394 is well controlled. As a result, the light 114 reflected by the micro-mirror-mechanism 340 is precisely controlled and projected to the desired location.

Figure 6:
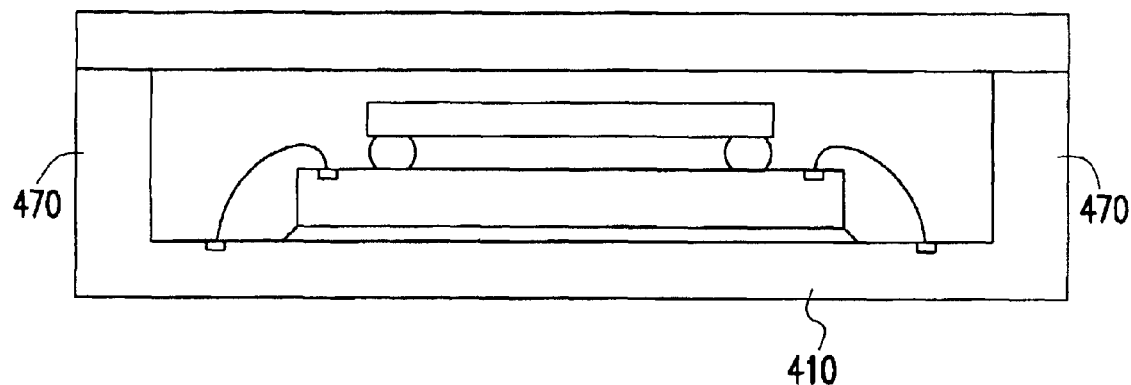
FIG. 6 is a cross-sectional, expanded view of a microsystem package structure according to a second preferred embodiment of the present invention.

As described above, the annular body is affixed to the substrate by adhesive, however, the scope of the present invention is not limited to the description set above. Referring to FIG. 6, which is a cross-sectional, expanded view of a microsystem package structure according to a second preferred embodiment of the present invention, the substrate 410 and the annular body 470 are indivisible. That is, the substrate 410 and the annular body 470 are fabricated integrally in the manufacture process.

Figure 7:
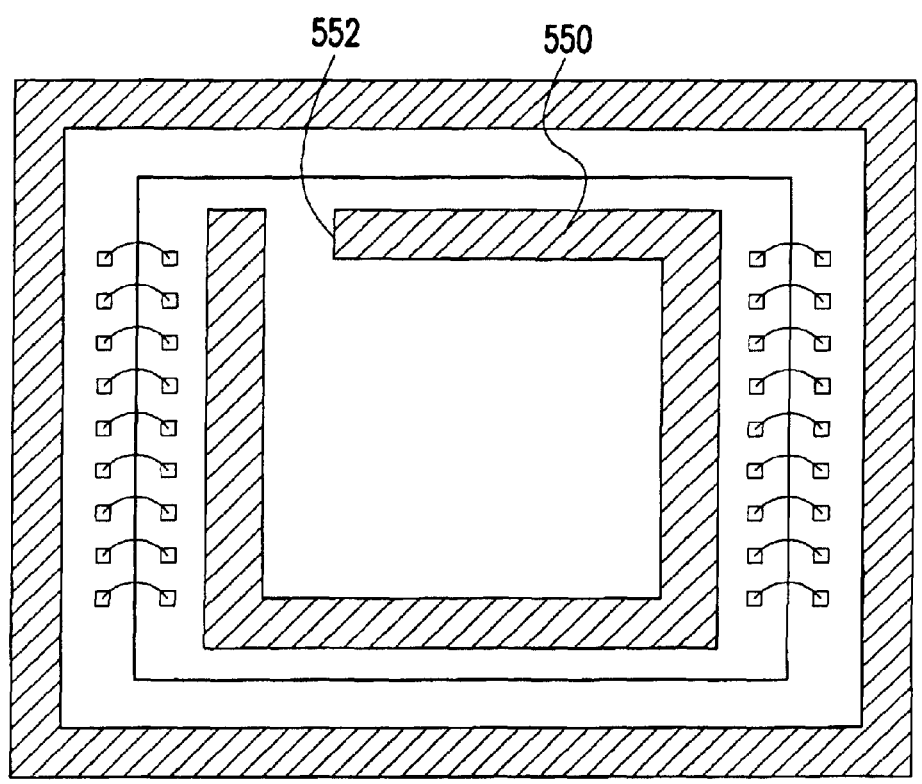
FIG. 7 is a top view of an adhesive structure according to a third preferred embodiment of the present invention.
Figure 8:
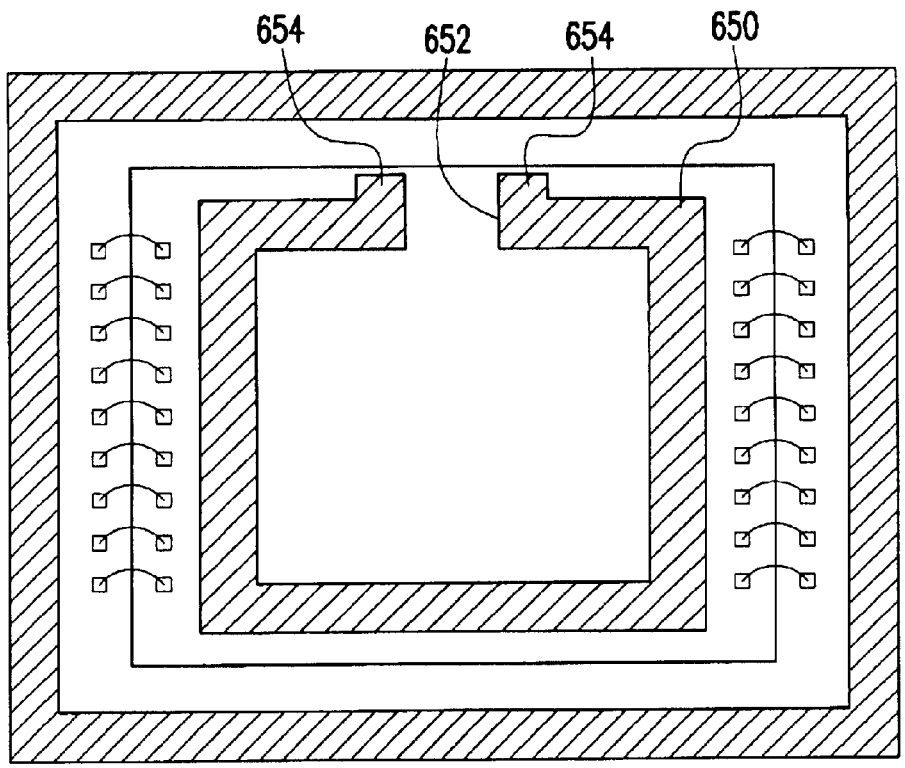
FIG. 8 is a top view of a adhesive structure according to a fourth preferred embodiment of the present invention.
Figure 9:
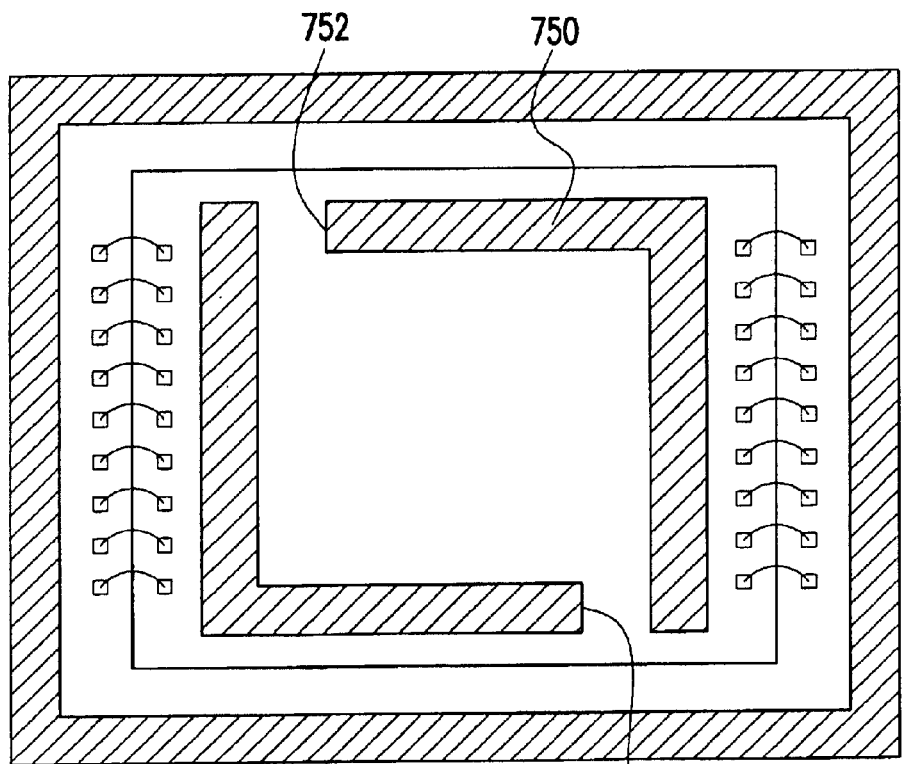
FIG. 9 is a top view of an adhesive structure according to a fifth preferred embodiment of the present invention.

In the previous embodiment, the opening of the adhesive structure is arranged in the central portion of one side of the adhesive structure; however, the arrangement of the adhesive structure is not limited to only the examples provided, but pertinent to other possible modification. FIGS. 7–9 are top views of an adhesive structure according to several preferred embodiments of the present invention. Referring to FIG. 7, the adhesive structure 550 has a shape of a hollow tetragon, with the opening 552 situated at the corner of the adhesive structure 550. Referring to FIG. 8, the adhesive structure 650 has a shape of a hollow tetragon with the opening 652 situated at one side of the adhesive structure 650, while the adhesive structure 650 further includes a protrusion 654 around the opening 652 and on the outer side of the adhesive structure 650. Referring to FIG. 9, the adhesive structure 750 has a shape of a hollow tetragon and includes a plurality of openings 752 at the corners of the adhesive structure 750. For example, two openings 752 are arranged corner-wise and diagonally.

The scope of the present invention further comprises arranging other suitable micro-mechanical mechanism to the CMOS chip, but not limited to the micromirror-mechanism.

In conclusion, the present invention can greatly reduce distortion of the carrying substrate, resulting from generated heat during the operation of CMOS chip and from the focused light onto the micro-mirror-mechanism. If the interspace is closed (sealed), the generated heat will heat up the interspace and the pressure of this space is increased with the elevated temperature, leading to distortion of the above carrying substrate. However, in the present invention, the interspace is connected to the chamber through the opening of the adhesive structure, the pressure of the interspace is balanced and lowered, so that distortion of the carrying substrate is prevented and the angle or position of the micromirror is well controlled. As a result, the light reflected by the micro-mirror-mechanism is precisely controlled and projected to the desired location.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A microsystem package structure, comprising:
    a first substrate;
    a chip disposed on the first substrate and electrically connected to the first substrate;
    an adhesive structure disposed on the chip, wherein the adhesive structure has at least an opening and is in an annular shape;
    a carrying substrate disposed on the adhesive structure, wherein an interspace is formed between the chip, the adhesive structure and the carrying substrate;
    a micro-mechanism disposed on the carrying substrate;
    an annular body attached to the first substrate, wherein a chamber is formed between the annular body and the first substrate and wherein the chip, the carrying substrate, the micro-mechanism and the adhesive structure are disposed within the chamber; and
    a second substrate disposed on the annular body and sealed the chamber, wherein a pressure of the interspace is balanced with that of the chamber.

2. The microsystem package structure of claim 1, wherein a first surface of the chip comprises a memory region and a plurality of chip nodes are arranged along a peripheral region of the memory region on the first surface of the chip, and wherein the adhesive structure is disposed between the memory region and the chip nodes on the first surface of the chip.

3. The microsystem package structure of claim 1, wherein the micro-mechanism includes a micro-mirror mechanism and the micro-mirror mechanism includes a plurality of micro-mirror sets, each micro-mirror set comprising:
    a supporting stalk, wherein one end of the stalk is connected to the carrying substrate;
    a hinge, wherein the other end of the stalk is connected to the hinge; and
    a micromirror, wherein one side of the micromirror is connected to the hinge, so that the micromirror rotates by using the hinge as a rotation center.

4. The microsystem package structure of claim 1, wherein the microsystem package structure further comprises a plurality of wires, for electrically connecting the chip and the first substrate.

5. The microsystem package structure of claim 1, wherein the annular body and the first substrate are fabricated integrally.

6. The microsystem package structure of claim 1, wherein the microsystem package structure further comprises a desiccant in the closed chamber between the annular body, the second substrate and the first substrate.

7. The microsystem package structure of claim 1, wherein the second substrate is made of glass.

8. The microsystem package structure of claim 1, wherein the annular adhesive structure is tetragonal.

9. The microsystem package structure of claim 8, wherein the opening is disposed in a middle portion of a side of the adhesive structure.

10. The microsystem package structure of claim 8, wherein the opening is disposed at a corner of the adhesive structure.

11. The microsystem package structure of claim 8, wherein the adhesive structure has a plurality of openings at corners of the adhesive structure.

12. The microsystem package structure of claim 1, wherein the adhesive structure further includes a protrusion around the opening and on an outer side of the adhesive structure.

13. The microsystem package structure of claim 1, wherein the carrying substrate and the first substrate are transparent.

14. The microsystem package structure of claim 1, wherein the chip is a memory chip.

* * * * *